(12) United States Patent
Shibata et al.

(10) Patent No.: US 12,284,757 B2
(45) Date of Patent: Apr. 22, 2025

(54) WIRING CIRCUIT BOARD (71) Applicant: NITTO DENKO CORPORATION, Osaka (JP)

(72) Inventors: Shusaku Shibata, Osaka (JP); Hiroaki Machitani, Osaka (JP); Teppei Niino, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 180 days.

(21) Appl. No.: 17/908,470

(22) PCT Filed: Feb. 24, 2021

(86) PCT No.: PCT/JP2021/006918
§ 371 (c)(1),
(2) Date: Aug. 31, 2022

(87) PCT Pub. No.: WO2021/177114
PCT Pub. Date: Sep. 10, 2021

(65) Prior Publication Data
US 2023/0098947 A1 Mar. 30, 2023

(30) Foreign Application Priority Data
Mar. 4, 2020 (JP) .................................. 2020-036960

(51) Int. Cl.
*H05K 1/11* (2006.01)
*H05K 1/02* (2006.01)
(Continued)

(52) U.S. Cl.
CPC ........... *H05K 1/111* (2013.01); *H05K 1/0296* (2013.01); *H05K 1/05* (2013.01); *H05K 1/115* (2013.01);
(Continued)

(58) Field of Classification Search
None
See application file for complete search history.

(56) References Cited

U.S. PATENT DOCUMENTS 6,418,615 B1 * 7/2002 Rokugawa ........... H05K 3/4682
29/830
7,164,198 B2 * 1/2007 Nakamura ........... H05K 3/0061
257/774
(Continued)

FOREIGN PATENT DOCUMENTS

JP 2001-223469 A 8/2001
JP 2005-044990 A 2/2005
(Continued)

OTHER PUBLICATIONS

International Preliminary Report on Patentability issued by WIPO on Sep. 6, 2022, in connection with International Patent Application No. PCT/JP2021/006918.
(Continued)

*Primary Examiner* — Ishwarbhai B Patel
(74) *Attorney, Agent, or Firm* — Edwards Neils LLC; Jean C. Edwards, Esq.

(57) ABSTRACT

A wiring circuit board includes two insulating layers, a wiring layer, a pad portion, and a conductive connection portion. The wiring layer is on one side in a thickness direction of the first insulating layer, and has a contact portion. The second insulating layer is on one side in the thickness direction of the first insulating layer to cover the wiring layer. The pad portion is on one side in the thickness direction of the second insulating layer. The second insulating layer has a through opening portion and having an opening along at least a part of a peripheral end portion of the pad portion. The contact portion of the wiring layer faces the through opening portion. The conductive connection portion, is connected to at least the peripheral end portion of (Continued)

the pad portion, and the contact portion, and electrically connects the wiring layer to the pad portion.

5 Claims, 8 Drawing Sheets (51) Int. Cl.
*H05K 1/05* (2006.01)
*H05K 3/32* (2006.01)
*H05K 3/46* (2006.01)
*H05K 1/18* (2006.01)

(52) U.S. Cl.
CPC ............... *H05K 3/32* (2013.01); *H05K 3/46* (2013.01); *H05K 1/18* (2013.01); *H05K 2201/0338* (2013.01)

(56) References Cited

U.S. PATENT DOCUMENTS

| 8,426,966 B1* | 4/2013 | Huemoeller | ............ H01L 24/03 257/E23.021 |
| 9,723,729 B2* | 8/2017 | Furusawa | ............ H05K 1/115 |
| 2016/0050755 A1 | 2/2016 | Kang et al. | |
| 2016/0135326 A1* | 5/2016 | Kim | ............ H05K 3/4084 361/728 |
| 2017/0086306 A1 | 3/2017 | Nakamura et al. | |

FOREIGN PATENT DOCUMENTS

| JP | 2016-018577 A | 2/2016 |
| KR | 10-2016-0020761 A | 2/2016 |
| TW | 201717716 A | 5/2017 |

OTHER PUBLICATIONS

Office Action, which was issued by the Taiwanese Patent Office on Jun. 3, 2024, in connection with Taiwanese Patent Application No. 110107280.
International Search Report issued in PCT/JP2021/006918 on Apr. 27, 2021.
Written Opinion issued in PCT/JP2021/006918 on Apr. 27, 2021.
Office Action, which was issued by the Japanese Patent Office on Oct. 17, 2023, in connection with Japanese Patent Application No. 2020-036960.
Office Action, issued by the Korean Intellectual Property Office on Jan. 22, 2025, in connection with Korean Patent Application No. 10-2022-7029706.

* cited by examiner

WIRING CIRCUIT BOARD

CROSS-REFERENCE TO RELATED APPLICATIONS

The present application is a 35 U.S.C. 371 National Stage Entry of for PCT/JP2021/006918, filed on Feb. 24, 2021, which claims priority from Japanese Patent Application No. 2020-036960, filed on Mar. 4, 2020, the contents of all of which are herein incorporated by reference in their entirety.

TECHNICAL FIELD

The present invention relates to a wiring circuit board.

BACKGROUND ART

In a wiring circuit board having a multilayer wiring structure, conventionally, a pad portion for external connection disposed on one surface (outer surface) of the outermost interlayer insulating layer may be connected to another wiring located on the other surface-side of the insulating layer through a wiring which is pattern-formed on the outer surface of the insulating layer and a via penetrating the insulating layer. However, in such a configuration, when a large number of pad portions are required to be disposed in a predetermined region of the wiring circuit board at high density, it may not be possible to form the pad portions at required arrangement density.

On the other hand, a so-called pad-on-via structure may be used in the wiring circuit board having a multilayer wiring structure, from the viewpoint of realizing high density arrangement of the pad portions.

Figure 10:
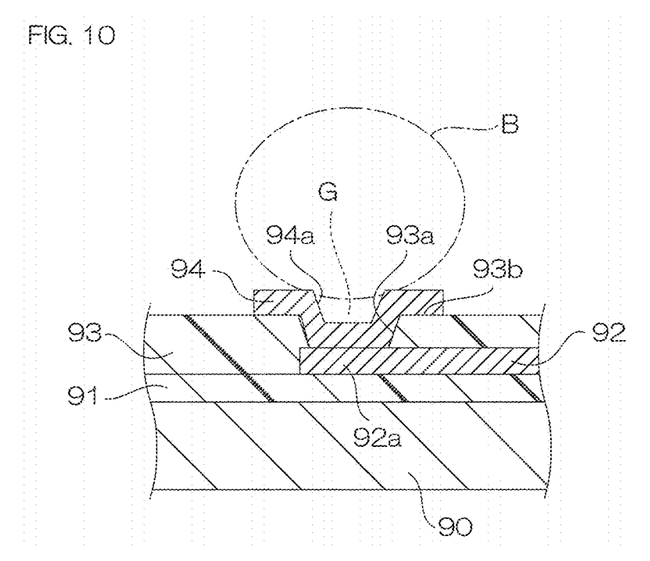
FIG. 10 shows a partially cross-sectional view illustrating one example of a pad-on-via structure.

FIG. 10 shows one example of a pad-on-via structure. The pad-on-via structure shown in FIG. 10 includes an insulating layer 91 on a substrate 90, a wiring layer 92 thereon, and an insulating layer 93 disposed on the insulating layer 91 so as to cover the wiring layer 92. The insulating layer 93 has a via hole 93a, and the wiring layer 92 has a portion 92a facing the via hole 93a. A conductive layer 94 is formed along the portion 92a, an inner wall surface of the via hole 93a, and a region 93b around the upper end, in the drawing, of the via hole 93a in the insulating layer 93. The conductive layer 94 is, for example, circular when viewed from the top, and forms a pad portion. The art relating to the pad-on-via structure is, for example, described in Patent Document 1 below.

CITATION LIST

Patent Document

Patent Document 1: Japanese Unexamined Patent Publication No. 2016-18577

SUMMARY OF THE INVENTION

Problem to be Solved by the Invention

However, in the pad-on-via structure shown in FIG. 10, the conductive layer 94 forming the pad portion has a recessed portion 94a in its exposed surface. Therefore, for example, when a solder bump B is bonded onto the conductive layer 94, a gap G (solder void) is easily formed between the solder bump B and the conductive layer 94. Formation of the gap G causes a decrease in a bonding strength of the solder bump B with respect to the conductive layer 94, which is not preferable.

The present invention provides a wiring circuit board suitable for realizing high density arrangement of a pad portion, while ensuring surface flatness of the pad portion.

Means for Solving the Problem

The present invention [1] includes a wiring circuit board including a first insulating layer; a wiring layer disposed on one side in a thickness direction of the first insulating layer; a second insulating layer disposed on one side in the thickness direction of the first insulating layer so as to cover the wiring layer; a pad portion disposed on one side in the thickness direction of the second insulating layer; and a conductive connection portion electrically connecting the wiring layer to the pad portion, wherein the second insulating layer has a through opening portion penetrating the second insulating layer in the thickness direction and having an opening along at least a part of a peripheral end portion of the pad portion; the wiring layer has a contact portion facing the through opening portion; and the conductive connection portion is disposed in the through opening portion, is connected to at least the part of the peripheral end portion of the pad portion, and is connected to the contact portion of the wiring layer.

The wiring circuit board of the present invention, as described above, includes the pad portion disposed on one side in the thickness direction of the second insulating layer. Since the pad portion is located on the second insulating layer, the pad portion is easily formed as a pad portion having a flat exposed surface (main surface for external connection). That is, the wiring circuit board is suitable for ensuring surface flatness of the pad portion. Along with this, the wiring circuit board, as described above, includes the conductive connection portion which is connected to at least the part of the peripheral end portion of the pad portion and connected to the contact portion of the wiring layer. A wiring pattern on the second insulating layer for electrical connection between the wiring layer and the pad portion is not necessary in the wiring circuit board. In the wiring circuit board, the wiring layer and the pad portion are electrically connected without providing such a wiring pattern on the second insulating layer, and therefore, it is easy to dispose the pad portion at high density. That is, the wiring circuit board is suitable for realizing high density arrangement of the pad portion.

The present invention [2] includes the wiring circuit board described in the above-described [1], wherein the opening of the through opening portion is along an entire circumference of the peripheral end portion of the pad portion, and the conductive connection portion is connected to the peripheral end portion over the entire circumference of the peripheral end portion.

Such a configuration is suitable for ensuring large connection area between the pad portion and the conductive connection portion, and therefore, is suitable for realizing high connection reliability between the pad portion and the conductive connection portion.

The present invention [3] includes the wiring circuit board described in the above-described [1], wherein the conductive connection portion has an expanding shape from the contact portion of the wiring layer over the peripheral end portion of the pad portion in a projection view in the thickness direction.

Such a configuration is suitable for ensuring large connection area between the pad portion and the conductive connection portion, and therefore, is suitable for realizing the high connection reliability between the pad portion and the conductive connection portion.

The present invention [4] includes the wiring circuit board described in any one of the above-described [1] to [3], wherein an opening end of the through opening portion in a surface on one side in the thickness direction of the second insulating layer includes a first edge in contact with the pad portion and along the peripheral end portion, and a second edge away from the pad portion and opposite to the first edge; and the conductive connection portion is not in contact with a portion or a whole of the second edge.

Such a configuration is suitable for further providing an additional pad portion in close proximity to the second edge of the through opening portion on one side in the thickness direction of the second insulating layer, and therefore, is suitable for realizing the high density arrangement of the pad portion.

The present invention [5] includes the wiring circuit board described in any one of the above-described [1] to [4], wherein the contact portion of the wiring layer closes an opening end of the through opening portion in a surface on the other side in the thickness direction of the second insulating layer.

Such a configuration is suitable for ensuring the large connection area between the wiring layer and the conductive connection portion disposed in the through opening portion, and therefore, is suitable for realizing the high connection reliability between the wiring layer and the conductive connection portion.

BRIEF DESCRIPTION OF THE DRAWINGS

FIGS. 5A to 5E show a part of the steps in a method for producing the wiring circuit board shown in FIG. 1:
 FIG. 5A illustrating a preparation step,
 FIG. 5B illustrating a first insulating layer forming step,
 FIG. 5C illustrating a first conductive layer forming step,
 FIG. 5D illustrating a second insulating layer forming step, and
 FIG. 5E illustrating a second conductive layer forming step.

FIGS. 6A to 6C each shows a partially cross-sectional view of each modified example of the wiring circuit board shown in FIG. 1:
 FIG. 6A illustrating a modified example further having a pad portion which is pattern-formed on a second insulating layer;
 FIG. 6B illustrating a modified example further having a pad portion which is pattern-formed on the second insulating layer, and having a third insulating layer; and
 FIG. 6C illustrating a modified example further having a wiring layer which is pattern-formed on the second insulating layer, and having the third insulating layer.

FIG. 7A illustrating a partially cross-sectional view of the modified example,
 FIG. 7B illustrating a partially plan view of the modified example, and
 FIG. 7C illustrating a portion-omitted partially plan view of the modified example (in FIG. 7C, the pad portion and the conductive connection portion are omitted).

FIG. 8A illustrating a partially cross-sectional view of the modified example,
 FIG. 8B illustrating a partially plan view of the modified example, and
 FIG. 8C illustrating a portion-omitted partially plan view of the modified example (in FIG. 8C, the pad portion and the conductive connection portion are omitted).

FIG. 9A illustrating a partially cross-sectional view of the modified example,
 FIG. 9B illustrating a partially plan view of the modified example, and
 FIG. 9C illustrating a portion-omitted partially plan view of the modified example (in FIG. 9C, the pad portion and the conductive connection portion are omitted).

DESCRIPTION OF EMBODIMENTS

Figure 1:
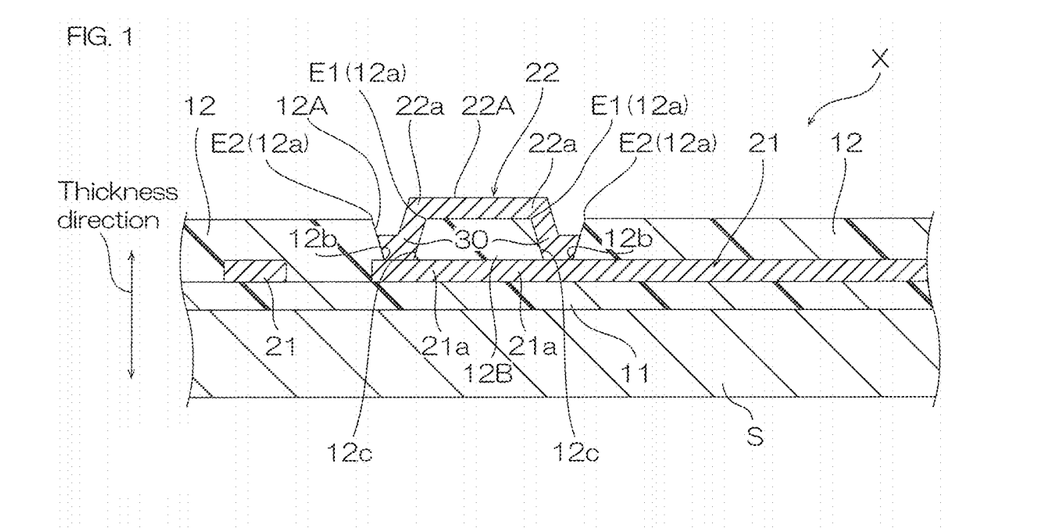
FIG. 1 shows a partially cross-sectional view of one embodiment of a wiring circuit board of the present invention.
Figure 2:
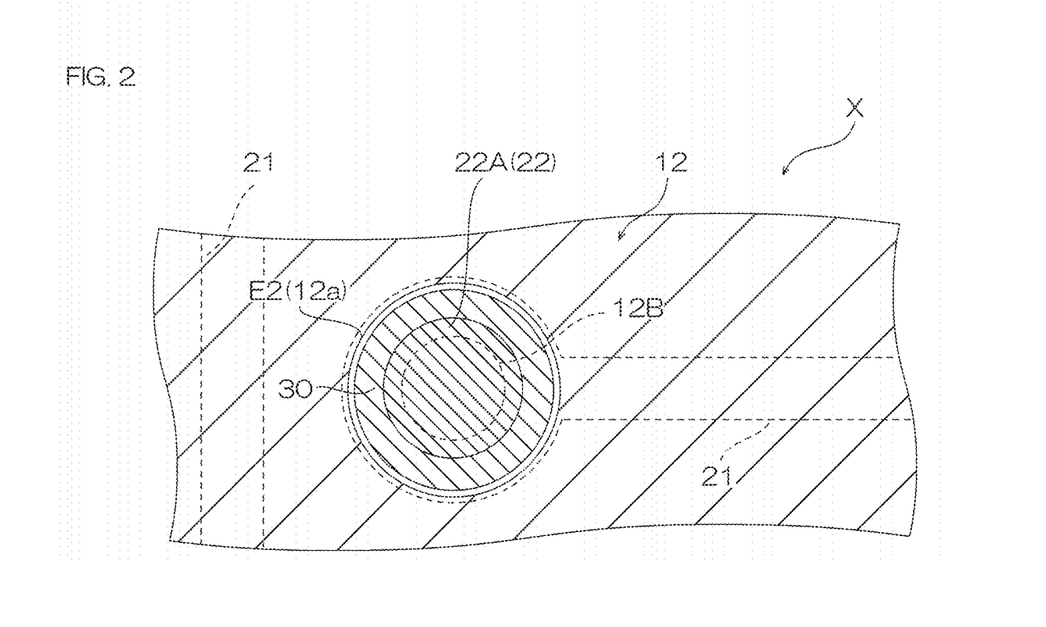
FIG. 2 shows a partially plan view of the wiring circuit board shown in FIG. 1.
Figure 3:
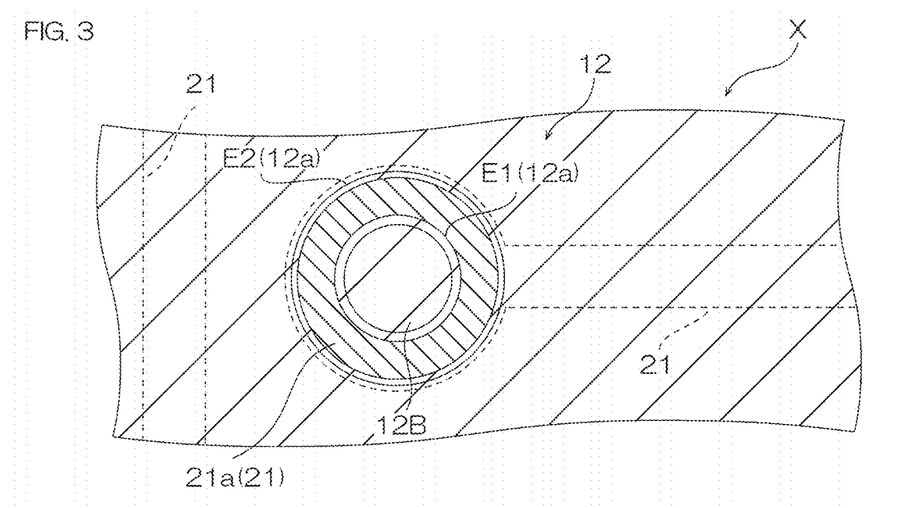
FIG. 3 shows a portion-omitted partially plan view of the wiring circuit board shown in FIG. 1, in which a pad portion and a conductive connection portion are omitted.

FIGS. 1 to 3 show a wiring circuit board X which is one embodiment of the present invention. FIG. 1 shows a partially cross-sectional view of the wiring circuit board X. FIG. 2 shows a partially plan view of the wiring circuit board X. FIG. 3 shows a portion-omitted partially plan view of the wiring circuit board X (a pad portion 22 and a conductive connection portion 30 to be described later are omitted).

The wiring circuit board X includes a substrate S, an insulating layer 11 (first insulating layer), an insulating layer 12 (second insulating layer), a wiring layer 21 (first wiring layer), a pad portion 22 (first pad portion), and a conductive connection portion 30.

The substrate S is an element for ensuring mechanical strength of the wiring circuit board X, and is provided in a whole or a portion of the region of the wiring circuit board X.

When the wiring circuit board X is configured as a flexible wiring circuit board, the substrate S is a flexible substrate made of metal. Examples of a material for the flexible substrate include copper, copper alloy, stainless steel, and 42-alloy. An example of the stainless steel includes SUS304 based on standards of AISI (American Iron and Steel Institute). A thickness of the substrate S as a flexible substrate made of metal is, for example, 15 μm or more, and for example, 500 μm or less, preferably 250 μm or less.

When the wiring circuit board X is configured as a rigid wiring circuit board, the substrate S is a rigid board.

Examples of the rigid board include glass epoxy boards and metal flat plates. A thickness of the substrate S as a rigid board is, for example, 0.1 mm or more, and for example, 2 mm or less, preferably 1.6 mm or less.

The insulating layer 11 is a base insulating layer disposed on one side in a thickness direction of the substrate S. In the present embodiment, the insulating layer 11 is disposed on one surface in the thickness direction of the substrate S. Examples of a material for the insulating layer 11 include resin materials such as polyimide, polyether nitrile, polyether sulfone, polyethylene terephthalate, polyethylene naphthalate, and polyvinyl chloride (as a material for the insulating layer 12 and an insulating layer 13 to be described later, the same resin material is used). A thickness of the insulating layer 11 is, for example, 1 µm or more, preferably 3 µm or more, and for example, 35 µm or less, preferably 15 µm or less.

The wiring layer 21 is disposed on one side in the thickness direction of the insulating layer 11, and has a predetermined pattern shape. In the present embodiment, the wiring layer 21 is disposed on one surface in the thickness direction of the insulating layer 11. Further, the wiring layer 21 has a contact portion 21a facing a through opening portion 12A to be described later of the insulating layer 12. The contact portion 21a is, for example, located at a distal end portion (free end portion) or the vicinity thereof in the wiring layer 21 in a predetermined pattern. A thickness of the wiring layer 21 is, for example, 3 µm or more, preferably 5 µm or more, and for example, 50 µm or less, preferably 30 µm or less. A width (dimension in a direction perpendicular to an extending direction of the wiring layer 21) of the wiring layer 21 is, for example, 5 µm or more, preferably 8 µm or more, and for example, 100 µm or less, preferably 50 µm or less. Examples of a material for the wiring layer 21 include copper, nickel, gold, solder, and alloys of these, and preferably, copper is used.

The insulating layer 12 is disposed on one side in the thickness direction of the insulating layer 11 so as to cover the wiring layer 21. In the present embodiment, the insulating layer 12 is disposed on one surface in the thickness direction of the insulating layer 11 so as to cover the wiring layer 21. The insulating layer 12 has a through opening portion 12A penetrating the insulating layer 12 in the thickness direction. The through opening portion 12A has an opening end 12a on one side in the thickness direction and an opening end 12b on the other side in the thickness direction.

The through opening portion 12A has an opening along at least a part of a peripheral end portion 22a to be described later of the pad portion 22 on one side in the thickness direction. In the present embodiment, the opening of the through opening portion 12A is along the entire circumference of the peripheral end portion 22a. That is, the through opening portion 12A has an annular shape along the peripheral end portion 22a of the pad portion 22 when viewed from the top. Then, the insulating layer 12 includes a land portion 12B surrounded by the through opening portion 12A. The land portion 12B has one surface in the thickness direction, and tapered peripheral side surfaces 12c which are inclined inwardly from the other side toward one side in the thickness direction. The maximum length (diameter of a circle when a shape of the land portion 12B is circular when viewed from the top) of the land portion 12B in the plane direction (direction perpendicular to the thickness direction) on one side in the thickness direction is, for example, 10 to 1000 µm. Further, the opening end 12a of the through opening portion 12A has an edge E1 (first edge) inside in a radial direction of the through opening portion 12A, and an edge E2 (second edge) opposite to the edge E1 (i.e., located outside in the radial direction of the through opening portion 12A). The edge E1 is in contact with the pad portion 22 and along the peripheral end portion 22a. The edge E2 is away from the pad portion 22. A separation distance between the edges E1 and E2 is, for example, 1 to 100 µm. In the present embodiment, the opening end 12b of the through opening portion 12A is closed by the contact portion 21a of the wiring layer 21.

A height of the insulating layer 12 from the insulating layer 11 is, for example, 4 µm or more, preferably 6 µm or more, and for example, 60 µm or less, preferably 40 µm or less as long as it is larger than the thickness of the wiring layer 21.

The pad portion 22 is disposed on one side in the thickness direction of the insulating layer 12, and has a predetermined shape when viewed from the top. In the present embodiment, the pad portion 22 is disposed on one surface in the thickness direction of the insulating layer 12 (the land portion 12B). Examples of a shape of the pad portion 22 when viewed from the top include circular, and rectangular such as square (illustratively showing a case where the shape of the pad portion 22 when viewed from the top is circular). The maximum length (diameter of the circle in a case where the shape of the pad portion 22 when viewed from the top is circular) of the pad portion 22 when viewed from the top is, for example, 15 to 1000 µm. Further, the pad portion 22 has a main surface 22A for external connection and the peripheral end portion 22a. A thickness of the pad portion 22 is, for example, 3 µm or more, preferably 5 µm or more, and for example, 50 µm or less, preferably 30 µm or less. Examples of a material for the pad portion 22 include copper, nickel, gold, solder, and alloys of these, and preferably, copper is used. Further, a plating film (not shown) such as Ni—Au plating film or Au plating film may be formed on the main surface 22A of the pad portion 22. Such a configuration is suitable for realizing an excellent bonding strength of the pad portion 22 with a solder material such as solder bump.

The conductive connection portion 30 is an element for electrically connecting the wiring layer 21 to the pad portion 22, and is disposed in the through opening portion 12A. Specifically, the conductive connection portion 30 is disposed on the peripheral side surface 12c of the land portion 12B, is connected to at least a part of the peripheral end portion 22a of the pad portion 22, and is connected to the contact portion 21a of the wiring layer 21. In the present embodiment, the conductive connection portion 30 is connected to the peripheral end portion 22a over the entire circumference of the peripheral end portion 22a. Further, the conductive connection portion 30 is preferably not in contact with a portion or a whole of the edge E2 of the opening end 12a of the through opening portion 12A. A case where the conductive connection portion 30 is not in contact with the whole of the edge E2 is illustratively shown.

Figure 4:
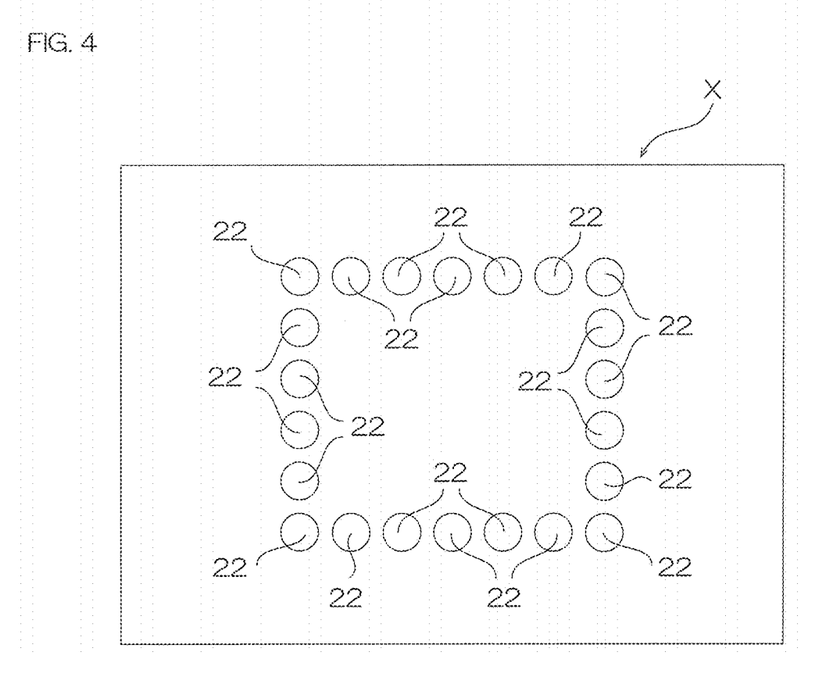
FIG. 4 shows a plan view illustrating one example of arrangement of a pad portion.

In the wiring circuit board X, the pad portion 22 is provided, for example, corresponding to the arrangement of a terminal of an electronic component in a region on which the electronic component such as a semiconductor device configured as CSP (chip size package) is mounted. In the electronic component mounting region of the wiring circuit board X, the plurality of pad portions 22 may be, for example, disposed as shown in FIG. 4. In the arrangement example shown in FIG. 4, the plurality of pad portions 22 are disposed so as to form a rectangular.

FIG. 5 shows one example of a method for producing the wiring circuit board X. FIG. 5 shows the producing method as a change in a cross section corresponding to FIG. 1.

Figure 5A:
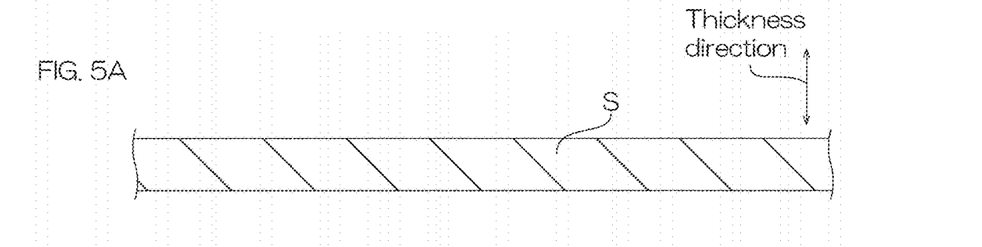

In the producing method, first, as shown in FIG. 5A, the substrate S is prepared (preparation step).

Figure 5B:
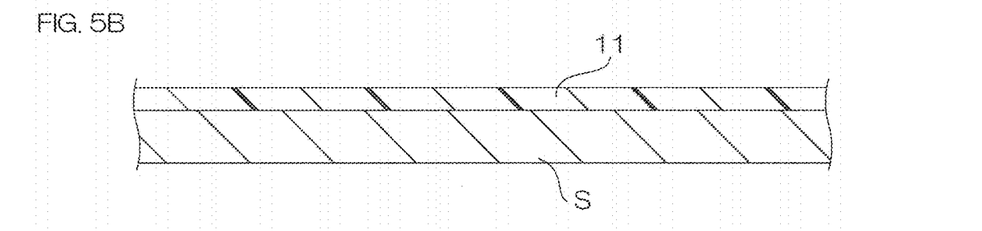

Next, as shown in FIG. 5B, the insulating layer 11 is formed on the substrate S (first insulating layer forming step). When the insulating layer 11 has a predetermined pattern shape when viewed from the top, in this step, for example, a solution (varnish) of a photosensitive resin is applied onto the substrate S to be dried, and thereafter, a coating film thus formed is subjected to exposure treatment through a predetermined mask, subsequent development treatment, and subsequent bake treatment as needed. For example, in this way, the insulating layer 11 can be formed on the substrate S.

Figure 5C:
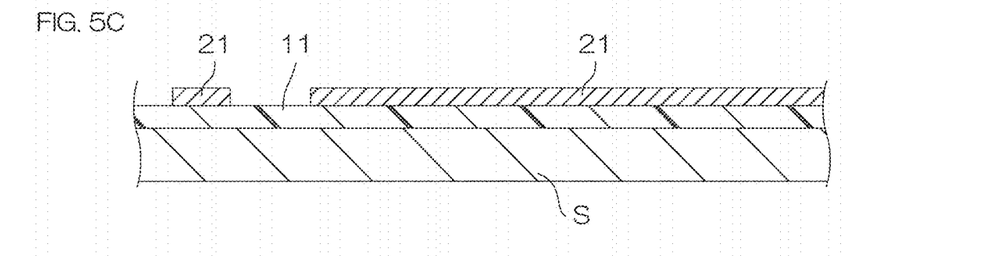

Next, as shown in FIG. 5C, the wiring layer 21 is pattern-formed on the insulating layer 11 (first conductive layer forming step). In this step, first, a seed layer (not shown) is formed on an exposed surface of the insulating layer 11 by, for example, a sputtering method. Examples of a material for the seed layer include Cr, Cu, Ni, Ti, and alloys of these (the same applies to a material for the seed layer to be described later). Next, a resist pattern is formed on the seed layer. The resist pattern has an opening portion having a shape corresponding to a pattern shape of the wiring layer 21. In the formation of the resist pattern, for example, after a photosensitive resist film is bonded onto the seed layer to form a resist film, the resist film is subjected to exposure treatment through a predetermined mask, subsequent development treatment, and subsequent bake treatment as needed (the same applies to the formation of the resist pattern to be described later). In the formation of the wiring layer 21, next, a metal material is grown on the seed layer in the opening portion of the resist pattern by an electrolytic plating method. As the metal material, preferably, copper is used. Next, the resist pattern is removed by etching. Next, a portion exposed by resist pattern removal in the seed layer is removed by etching. For example, as described above, it is possible to form the wiring layer 21 in a predetermined pattern on the insulating layer 11.

Figure 5D:
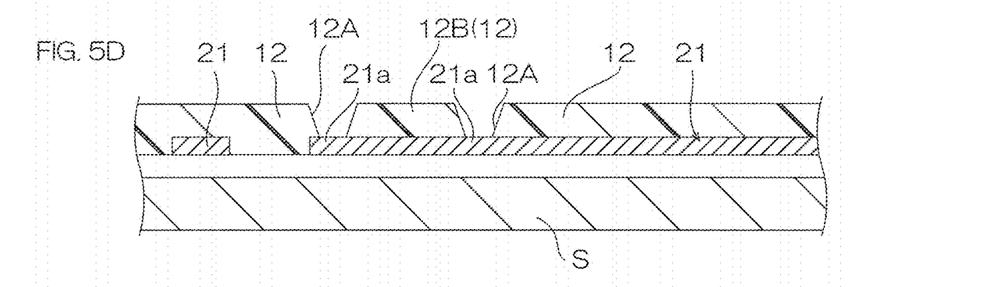

In the producing method, next, as shown in FIG. 5D, the insulating layer 12 is formed on the insulating layer 11 so as to cover the wiring layer 21 (second insulating layer forming step). In this step, for example, a solution (varnish) of a photosensitive resin is applied onto the insulating layer 11 and the wiring layers 21 to be dried, and thereafter, a coating film thus formed is subjected to exposure treatment through a predetermined mask, subsequent development treatment, and subsequent bake treatment as needed. In this step, the insulating layer 12 is formed so as to have the through opening portion 12A which exposes the contact portion 21a of the wiring layer 21.

Figure 5E:
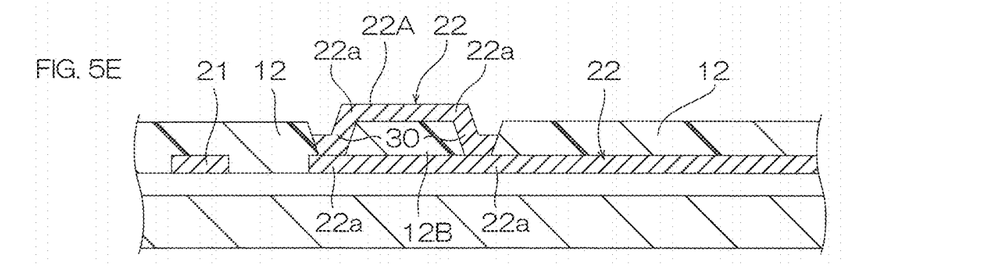

Next, as shown in FIG. 5E, the pad portion 22 and the conductive connection portion 30 are formed (second conductive portion forming step). In this step, first, a seed layer (not shown) is formed on one surface in the thickness direction in the insulating layer 12, and the surface of the through opening portion 12A by, for example, a sputtering method. Next, a resist pattern is formed on the seed layer. The resist pattern has an opening portion having a shape corresponding to the pattern shape of the pad portion 22 and the conductive connection portion 30. In this step, next, a metal material is grown on the seed layer in the opening portion of the resist pattern by an electrolytic plating method. As the metal material, preferably, copper is used. Next, the resist pattern is removed by etching. Then, a portion exposed by resist pattern removal in the seed layer is removed by etching. For example, as described above, it is possible to form the pad portion 22 on the insulating layer 12, and form the conductive connection portion 30 in the through opening portion 12A.

A plating film such as Ni—Au plating film or Au plating film may be formed on the main surface 22A of the pad portion 22 formed in this step by, for example, an electroless plating method. Further, for example, in order to realize the configuration of various modified examples to be described later, after this step, a conductive layer in a predetermined pattern including the pad portion and/or the wiring layer may be formed on one surface in the thickness direction of the insulating layer 12, a third insulating layer in a predetermined pattern as a cover insulating layer may be further formed so as to cover the conductive layer, or the third insulating layer may be formed in lamination without providing the conductive layer.

For example, by undergoing such steps as described above, it is possible to produce the wiring circuit board X.

The wiring circuit board X, as described above, includes the pad portion 22 disposed on one side in the thickness direction of the insulating layer 12. Since the pad portion 22 is located on the insulating layer 12 (the land portion 12B) having flat one surface in the thickness direction, it is easily formed as a pad portion having the flat main surface 22A. That is, the wiring circuit board X is suitable for ensuring surface flatness of the pad portion 22.

Along with this, the wiring circuit board X, as described above, includes the conductive connection portion 30 which is connected to at least a part of the peripheral end portion 22a of the pad portion 22 and connected to the contact portion 21a of the wiring layer 21. A wiring pattern on the insulating layer 12 for electrical connection between the wiring layer 21 and the pad portion 22 is not necessary in the wiring circuit board X. In the wiring circuit board X, the wiring layer 21 and the pad portion 22 are electrically connect without providing such a wiring pattern on the insulating layer 12, and therefore, it is easy to dispose the pad portion 22 at high density. That is, the wiring circuit board X is suitable for realizing high density arrangement of the pad portion 22.

As described above, the wiring circuit board X is suitable for realizing the high density arrangement of the pad portion 22, while ensuring the surface flatness of the pad portion 22.

In the wiring circuit board X, as described above, the through opening portion 12A of the insulating layer 12 has an opening along the entire circumference of the peripheral end portion 22a of the pad portion 22, and the conductive connection portion 30 is connected to the peripheral end portion 22a over the entire circumference of the peripheral end portion 22a. Such a configuration is suitable for ensuring large connection area between the pad portion 22 and the conductive connection portion 30, and therefore, is suitable for realizing high connection reliability between the pad portion 22 and the conductive connection portion 30.

In the wiring circuit board X, as described above, the opening end 12a of the through opening portion 12A of the insulating layer 12 includes the edges E1 and E2. The edge E1 is in contact with the pad portion 22 and along the peripheral end portion 22a, the edge E2 is away from the pad portion 22 and opposite to the edge E1, and the conductive connection portion 30 is not in contact with a portion or a whole of the edge E2. Such a configuration is suitable for further providing a pad portion in close proximity to the edge E2 of the through opening portion 12A on one side in the thickness direction of the insulating layer 12, and therefore, is suitable for realizing the high density arrangement of the pad portion.

In the wiring circuit board X, as described above, the contact portion 21a of the wiring layer 21 closes the opening end 12b of the through opening portion 12A in the surface on the other side in the thickness direction of the insulating layer 12. Such a configuration is suitable for ensuring the large connection area between the wiring layer 21 and the conductive connection portion 30 disposed in the through opening portion 12A, and therefore, is suitable for realizing the high connection reliability between the wiring layer 21 and the conductive connection portion 30.

Figure 6A:
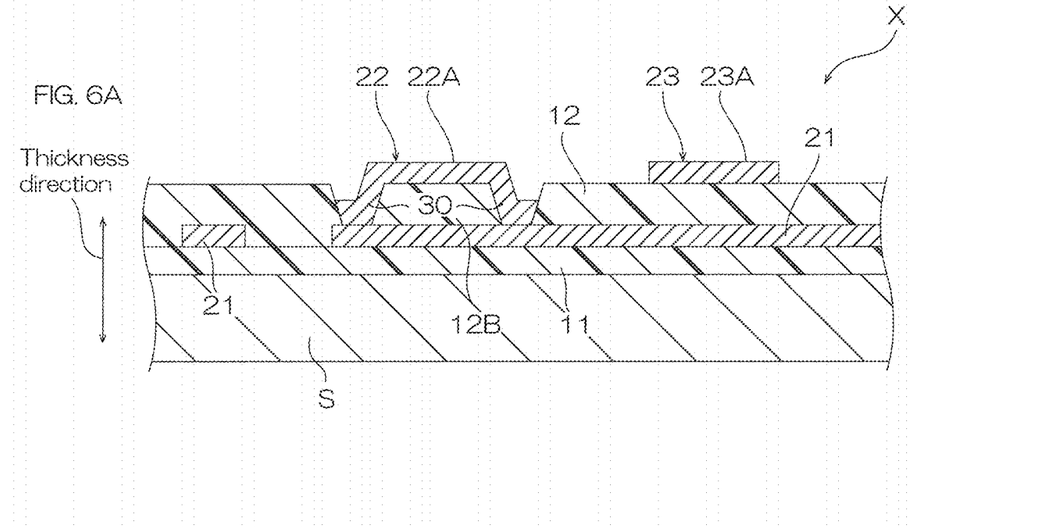

The wiring circuit board X, as shown in FIG. 6A, may be provided with the pad portion 23 (second pad portion) on one surface in the thickness direction of the insulating layer 12. The pad portion 23 is located away from the through opening portion 12A in the plane direction. The pad portion 23 has the main surface 23A for external connection, and is electrically connected to a portion of the wiring layer 21 through a wiring (not shown) and a via (not shown), where the wiring is pattern-formed on one surface in the thickness direction of the insulating layer 12 and connected to the pad portion 23, and the via penetrates the insulating layer 12 and connected to the wiring. Examples of a shape of the pad portion 23 when viewed from the top include circular, and rectangular such as square. As the thickness and material of the pad portion 23, the same thickness and material of the pad portion 22 as described above is used.

Since the pad portion 22 and the pad portion 23 are disposed on the insulating layer 12 having flat one surface in the thickness direction, they are easily formed as the pad portions having the flat main surfaces 22A and 23A, and a difference in height of the main surfaces 22A and 23A (height from the insulating layer 12) is easily suppressed. According to such a configuration, it is easy to mount the electronic component on the wiring circuit board X through the pad portions 22 and 23 appropriately. In the plurality of pad portions for mounting the electronic components provided in the wiring circuit board, the higher the surface flatness of each pad portion and the smaller the variation in height between the pad portions, the easier to mount the electronic component on the wiring circuit board through the plurality of pad portions appropriately.

Figure 6B:
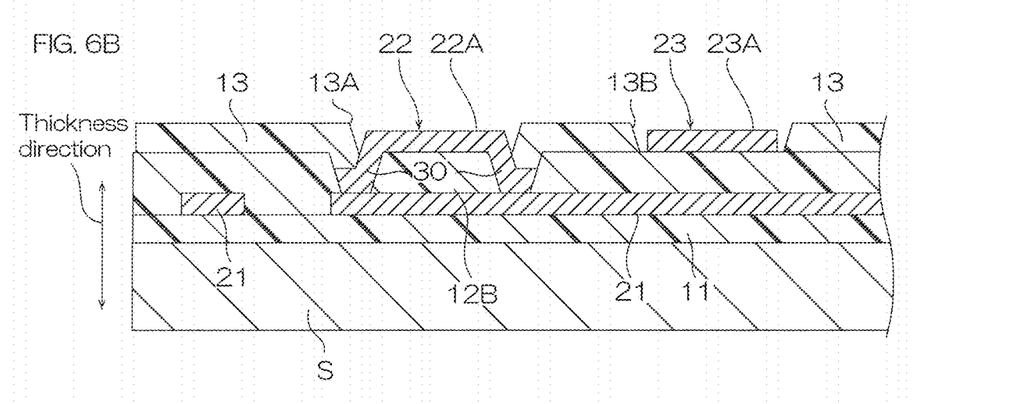

As shown in FIG. 6B, the wiring circuit board X may include the insulating layer 13 (third insulating layer) as a cover insulating layer on one surface in the thickness direction of the insulating layer 12. In the modified example shown in FIG. 6B, the pad portion 23 described above and the insulating layer 13 are provided on one surface in the thickness direction of the insulating layer 12, and the insulating layer 13 has a pattern shape exposing the pad portions 22 and 23. Specifically, the insulating layer 13 has an opening portion 13A exposing the pad portion 22, and an opening portion 13B exposing the pad portion 23. The conductive connection portion 30 is covered and protected by the insulating layer 13. Such a configuration is suitable for ensuring electrical connection reliability between the wiring layer 21 and the pad portion 22 by the conductive connection portion 30.

Figure 6C:
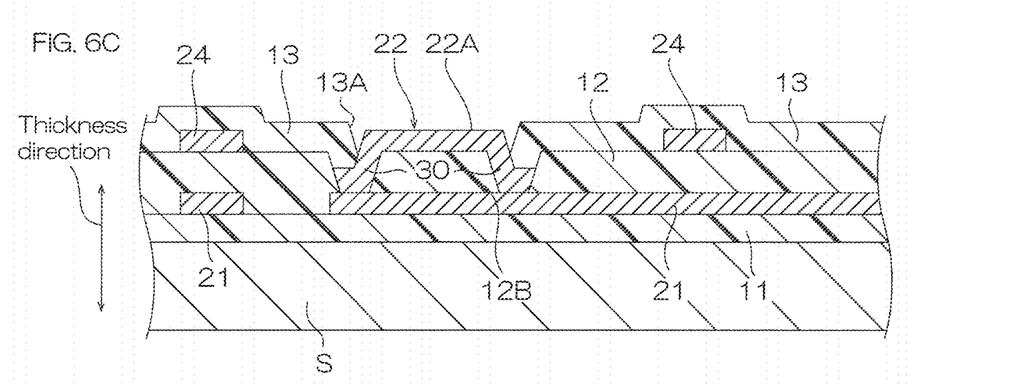

As shown in FIG. 6C, the wiring circuit board X may include a wiring layer 24 having a predetermined pattern shape (second wiring layer), and the insulating layer 13 as a cover insulating layer on one surface in the thickness direction of the pad portion 22. The thickness, the width, and the material of the wiring layer 24 are the same as those of the wiring layer 21 described above. The insulating layer 13 of the modified example is disposed on one surface in the thickness direction of the insulating layer 12 so as to cover the wiring layer 24, and has the opening portion 13A exposing the pad portion 22. The wiring circuit board X may also have such a multilayer wiring structure including the wiring layers 21 and 24. That the wiring circuit board X has a multilayer wiring structure is suitable for realizing high wiring density.

Figure 7A:
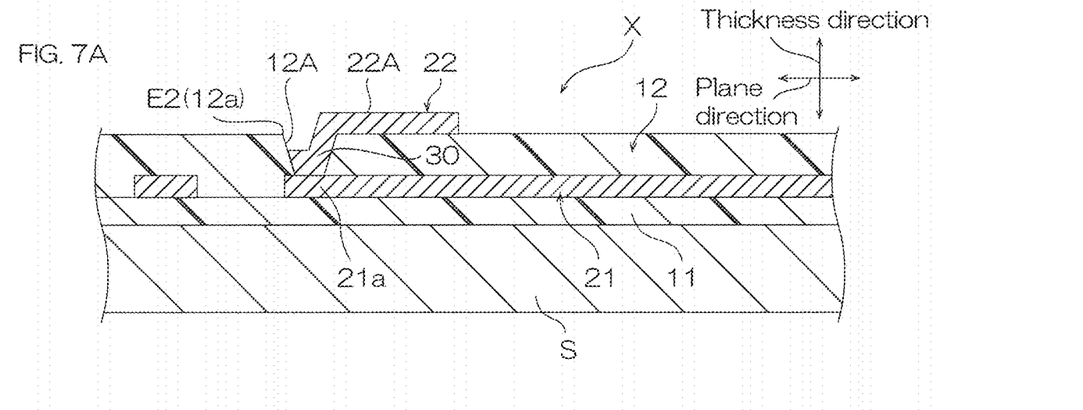
FIGS. 7A to 7C show another modified example of the wiring circuit board shown in FIG. 1 in which a pad portion is disposed at the same side as the wiring layer in a plane direction with respect to a conductive connection portion connected to the pad portion and the wiring layer.
Figure 7B:
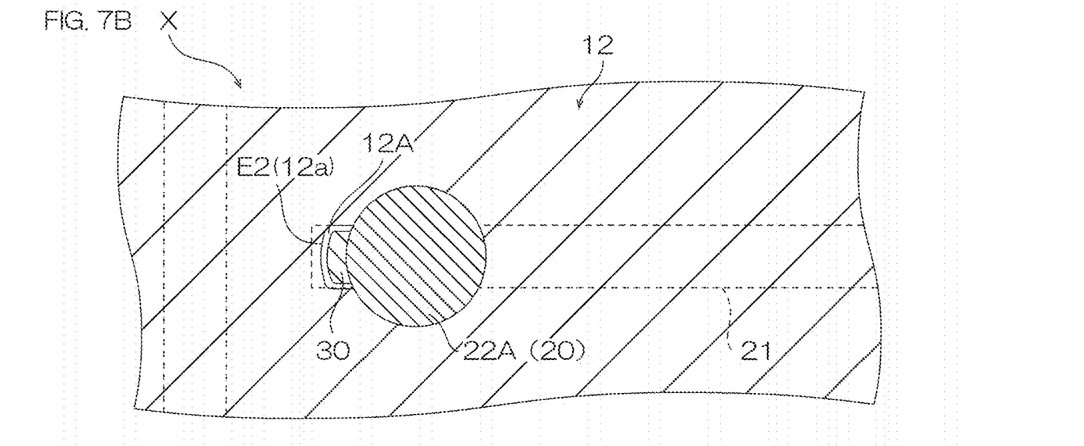
Figure 7C:
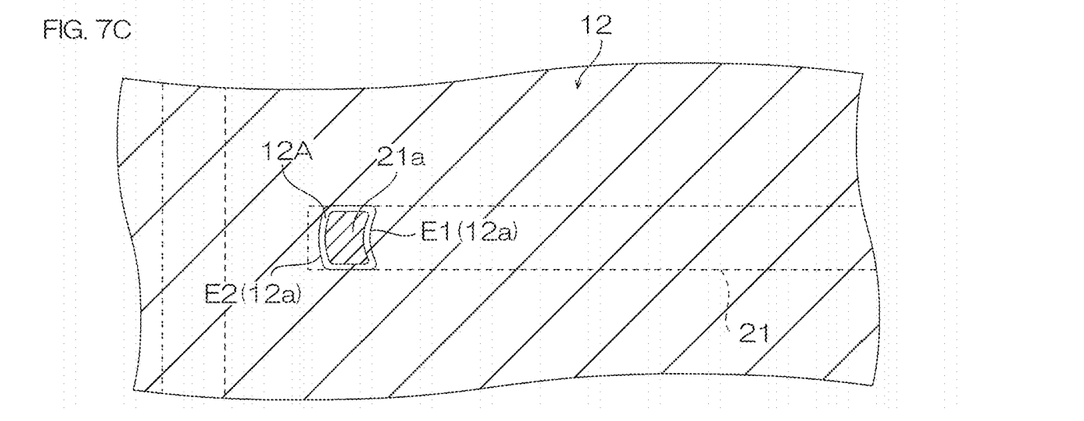
Figure 8A:
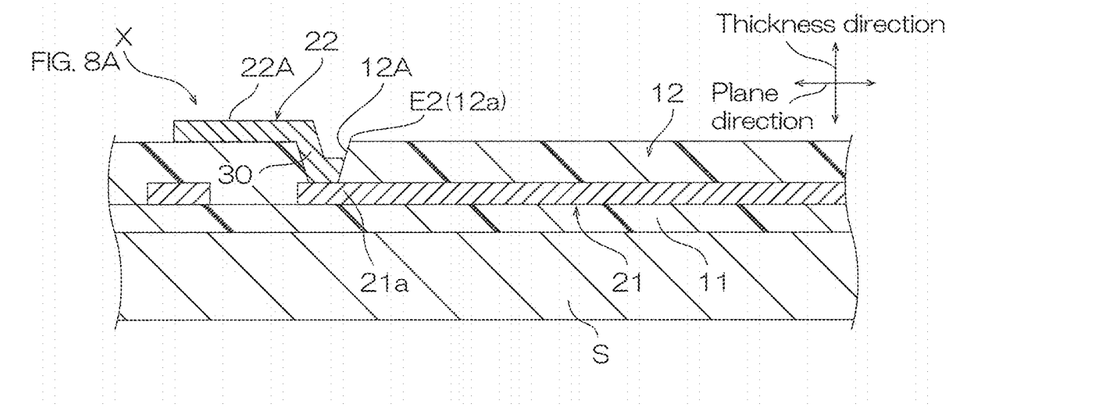
FIGS. 8A to 8C show another modified example of the wiring circuit board shown in FIG. 1 in which a pad portion is disposed at the opposite side to the wiring layer in a plane direction with respect to a conductive connection portion connected to the pad portion and the wiring layer.
Figure 8B:
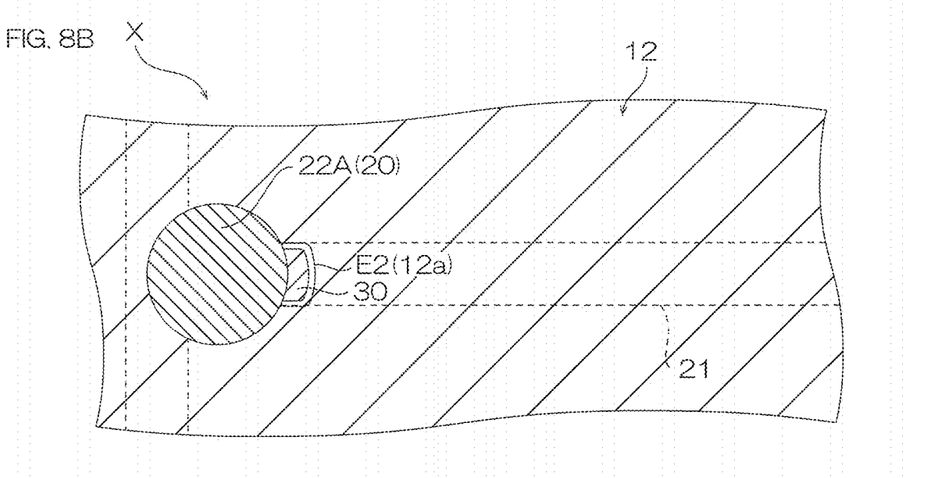
Figure 8C:
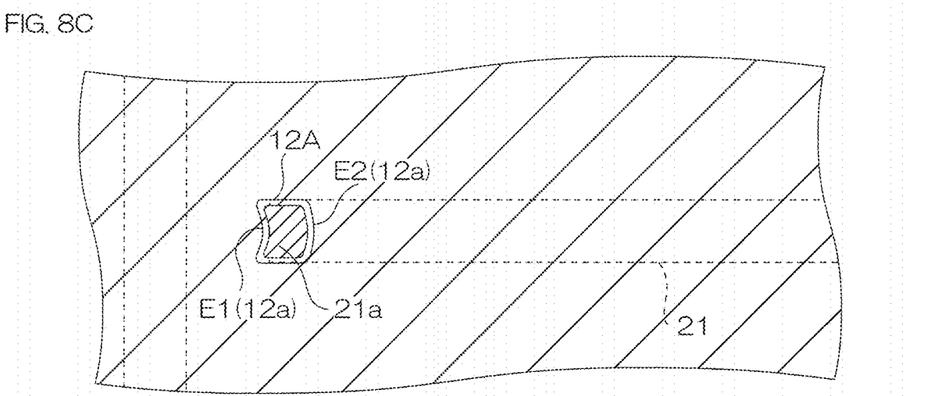
Figure 9A:
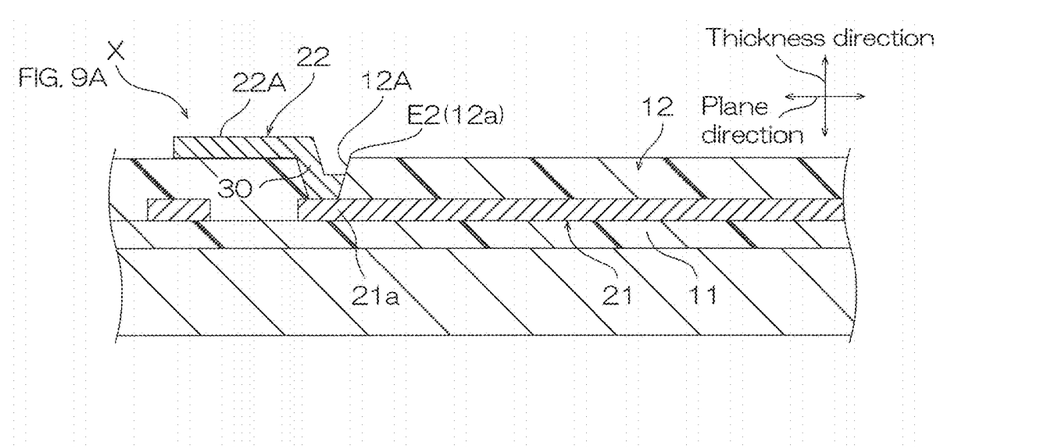
FIGS. 9A to 9C show another modified example of the wiring circuit board shown in FIG. 1 in which a conductive connection portion is connected to a part of a peripheral end portion of a pad portion, and the conductive connection portion has an expanding shape from a contact portion of a wiring layer over the peripheral end portion of the pad portion in a projection view in the thickness direction.
Figure 9B:
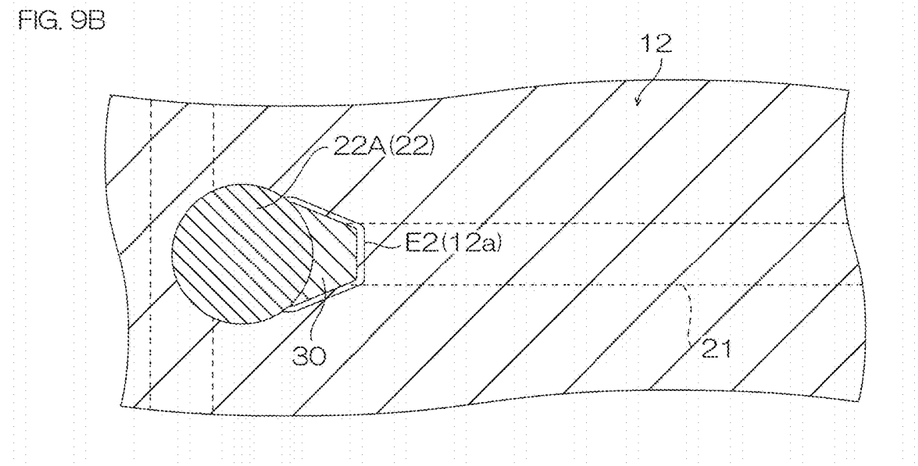
Figure 9C:
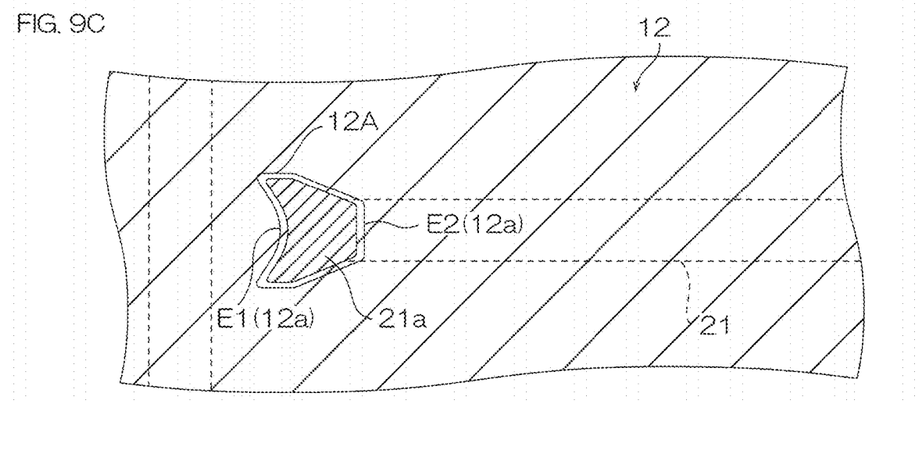

In the wiring circuit board X, for example, as shown in FIGS. 7A to 9C, the through opening portion 12A of the insulating layer 12 has an opening along a part of the peripheral end portion 22a of the pad portion 22, and the conductive connection portion 30 disposed in the through opening portion 12A may be connected to the part of the peripheral end portion 22a of the pad portion 22 and connected to the contact portion 21a of the wiring layer 21 (FIGS. 7A, 8A, and 9A show partially cross-sectional views of each modified example; FIGS. 7B, 8B, and 9B show partially cross-sectional views of each modified example; and FIGS. 7C, 8C, and 9C show portion-omitted partially cross-sectional views of each modified example). Also in such a modified example, since the pad portion 22 is located on the insulating layer 12, it is easy to ensure the surface flatness of the pad portion 22, and since the wiring pattern for electrical connection between the pad portion 22 and the wiring layer 21 is not necessary on the insulating layer 12, it is easy to realize the high density arrangement of the pad portion 22.

In the modified example shown in FIGS. 7A to 7C, the pad portion 22 is disposed on the same side as the wiring layer 21 in the plane direction with respect to the conductive connection portion 30 connected to the pad portion 22 and the wiring layer 21. Such a configuration is suitable for disposing another pad portion in close proximity to the pad portion 22 in a region on the insulating layer 12 at the opposite side to the wiring layer 21 in the plane direction with respect to the conductive connection portion 30, and therefore, is suitable for achieving the high density of the pad portion arrangement in the wiring circuit board X.

In the modified example shown in FIGS. 8A to 8C, the pad portion 22 is disposed on the opposite side to the wiring layer 21 in the plane direction with respect to the conductive connection portion 30 connected to the pad portion 22 and the wiring layer 21. Such a configuration is suitable for disposing another pad portion in close proximity to the pad portion 22 in a region on the insulating layer 12 at the same side as the wiring layer 21 in the plane direction with respect to the conductive connection portion 30, and therefore, is suitable for achieving the high density of the pad portion arrangement in the wiring circuit board X.

In the modified example shown in FIGS. 9A to 9C, the conductive connection portion 30 has an expanding shape from the contact portion 21a of the wiring layer 21 over the peripheral end portion 22a of the pad portion 22 in a projection view in the thickness direction. Such a configuration is suitable for ensuring the large connection area between the pad portion 22 and the conductive connection portion 30, and therefore, is suitable for realizing the high connection reliability between the pad portion 22 and the conductive connection portion 30.

In each modified example shown in FIGS. 7A to 9C, the conductive connection portion 30 is preferably not in contact with a portion or a whole of the edge E2 of the opening end 12a of the through opening portion 12A (illustratively showing a case where the conductive connection portion 30 is not in contact with the whole of the edge E2). Such a configuration is suitable for further providing a pad portion in close proximity to the edge E2 of the through opening portion 12A on one side in the thickness direction of the insulating layer 12, and therefore, is suitable for achieving the high density of the pad portion arrangement.

INDUSTRIAL APPLICATION

The wiring circuit board of the present invention can be, for example, used for various flexible wiring circuit boards and rigid wiring circuit boards.

DESCRIPTION OF REFERENCE NUMERALS

X Wiring circuit board
S Substrate
11, 12, 13 Insulating layer
12A Through opening portion
12B Land portion
12a, 12b Opening end
E1, E2 Edge
21, 24 Wiring layer
21a Contact portion
22, 23 Pad portion
22A Main surface
22a Peripheral end portion
30 Conductive connection portion

The invention claimed is:

1. A wiring circuit board comprising:
a first insulating layer;
a wiring layer disposed on one side in a thickness direction of the first insulating layer;
a second insulating layer disposed on one side in the thickness direction of the first insulating layer so as to cover the wiring layer;
a pad portion disposed on one side in the thickness direction of the second insulating layer; and
a conductive connection portion electrically connecting the wiring layer to the pad portion, wherein
the second insulating layer has a through opening portion penetrating the second insulating layer in the thickness direction and having an opening along at least a part of a peripheral end portion of the pad portion;
the wiring layer has a contact portion facing the through opening portion;
the conductive connection portion is disposed in the through opening portion, is connected to at least the part of the peripheral end portion of the pad portion, and is connected to the contact portion of the wiring layer;
the through opening portion has an inner peripheral surface having a first opening end on one side in the thickness direction and a second opening end on the other side in the thickness direction;
the inner peripheral surface of the through opening portion has a tapered shape which is inclined outwardly from the second opening end toward the first opening end;
the second insulating layer includes a land portion surrounded by the through opening portion; and
the land portion has a peripheral side surface having a tapered shape which is inclined inwardly from an other-side end portion toward a one-side end portion.

2. The wiring circuit board according to claim 1, wherein
the second opening end and the other-side end portion of the peripheral side surface of the land portion are spaced at an interval, and
the conductive connection portion is in contact with the peripheral side surface of the land portion and the contact portion between the other-side end portion of the land portion and the second opening end.

3. The wiring circuit board according to claim 1, wherein the conductive connection portion has an expanding shape from the contact portion of the wiring layer over the peripheral end portion of the pad portion in a projection view in the thickness direction.

4. The wiring circuit board according to claim 1, wherein an opening end of the through opening portion in a surface on one side in the thickness direction of the second insulating layer includes a first edge in contact with the pad portion and along the peripheral end portion, and a second edge away from the pad portion and opposite to the first edge; and the conductive connection portion is not in contact with a portion or a whole of the second edge.

5. The wiring circuit board according to claim 1, wherein the contact portion of the wiring layer closes an opening end of the through opening portion in a surface on the other side in the thickness direction of the second insulating layer.

* * * * *